(12) United States Patent
Tabaian et al.

(10) Patent No.: US 7,397,230 B2
(45) Date of Patent: Jul. 8, 2008

(54) INTEGRATED FET SYNCHRONOUS MULTIPHASE BUCK CONVERTER WITH INNOVATIVE OSCILLATOR

(75) Inventors: Fereydun Tabaian, Newport Coast, CA (US); Hamed Sadati, Dubai (AE); Ali Hejazi, Dubai (AE)

(73) Assignee: NuPower Semiconductor, Inc., Newport Beach, CA (US)

( * ) Notice: Subject to any disclaimer, the term of this patent is extended or adjusted under 35 U.S.C. 154(b) by 87 days.

(21) Appl. No.: 11/301,192

(22) Filed: Dec. 12, 2005

(65) Prior Publication Data

US 2006/0125451 A1 Jun. 15, 2006

Related U.S. Application Data

(60) Provisional application No. 60/634,858, filed on Dec. 10, 2004, provisional application No. 60/634,910, filed on Dec. 10, 2004.

(51) Int. Cl.
*G05F 1/00* (2006.01)
*G05F 1/573* (2006.01)

(52) U.S. Cl. .................... 323/284; 323/274; 323/222

(58) Field of Classification Search ............... 323/282, 323/284, 286, 271, 274, 222
See application file for complete search history.

(56) References Cited

U.S. PATENT DOCUMENTS

| 5,821,734 | A  | * | 10/1998 | Faulk | ..................... 320/124 |
| 6,424,132 | B1 | * | 7/2002  | Wrathall | .................. 323/282 |
| 6,724,257 | B2 | * | 4/2004  | Wrathall | .................. 330/253 |
| 6,737,841 | B2 | * | 5/2004  | Wrathall | .................. 323/282 |

OTHER PUBLICATIONS

Data Sheet, Texas Instruments Inc., "High-Frequency, Multiphase Controller", pp. 1-21, Part No. TPS40090, SLUS578—Oct. 2003.

Data Sheet, Intersil Americas Inc., "Microprocessor CORE Voltage Regulator Precision Multi-Phase Buck PWM Controller for Mobile Applications", pp. 1-17, Part No. ISL6219A, Nov. 2002, FN9093.

Data Sheet, Maxim Integrated Products, "Parallelable Secondary-Side Synchronous Rectifier Driver and Feedback-Generator Controller ICs", pp. 1-25, Part No. MAX5058/MAX5059, 19-3045; Rev. 0; Oct. 2003.

(Continued)

*Primary Examiner*—Bao Q Vu
(74) *Attorney, Agent, or Firm*—Seyed Kaveh E. Rashidi-Yazd, Esq.; Troutman Sanders LLP

(57) ABSTRACT

A power conversion system, preferably a buck converter, having (i) an oscillator, (ii) a pulse width modulator, (iii) and a nonoverlap clock generator and level shifter, wherein the improvement comprises the elimination of an external resistor divider is described. The buck converter can convert input voltage ranging from approximately 3V to 5V down to approximately 0.7-1.0V, 1.2V, 1.5V, 1.8V, 2.5V, and 3.3V without the use of resistor dividers. The voltage input identifiers select one of the possible output settings for flexibility and accuracy. The integrated field emitting transistors can provide a continuous current of at least 6 A. Additionally, peak current mode and an oscillator enable multiphase operation, up to ten buck converters, for up to 60 A output current. The multiphase operation reduces the output inductor size, and number of bulk capacitors. Moreover, the multiphase operation yields higher efficiency and provides high transient response for demanding applications.

15 Claims, 9 Drawing Sheets

OTHER PUBLICATIONS

International Preliminary Report on Patentability Chapter 1 for International Application No. PCT/US05/44830, Jun. 4, 2007.

Written Opinion of the International Search Authority for International Application No. PCT/US05/44830, Jun. 4, 2007.

* cited by examiner

INTEGRATED FET SYNCHRONOUS MULTIPHASE BUCK CONVERTER WITH INNOVATIVE OSCILLATOR

CROSS-REFERENCE TO RELATED APPLICATIONS

This application claims benefit, under 35 U.S.C. § 119(e), of U.S. Provisional Application Ser. Nos. 60/634,858 and 60/634,910, both filed 10 Dec. 2004, the entire contents and substance of which are hereby incorporated by reference.

BACKGROUND

1. Field of the Invention

The present invention is related to power conversion system and, more particularly, to a multiphase switching regulator.

2. Description of Related Art

A buck converter, or step-down switch mode power supply, may also be referred to as a switch mode regulator. Buck converters are often used to step down the voltage in a given circuit. Buck converters receive a high direct current (DC) voltage source and, accordingly, output a lower desired DC voltage.

Popularity of the buck converter is due to its high efficiency and compact size. The buck converter can be used in place of bulky linear voltage regulators at high voltage inputs.

Linear voltage regulators tend to be inefficient. Often, the power devices used in linear voltage regulators must dissipate a large amount of power. Consequently, the linear regulators must be cooled, either by mounting them on heat-sinks or by forced-air cooling (e.g., a fan), resulting in the loss of efficiency. In applications where size and efficiency are critical, linear voltage regulators are outdated and cannot be used.

A buck converter overcomes some of the drawbacks of linear regulators. Buck converters are more efficient, as they tend to have an efficiency rating of 80% or better. Moreover, buck converters can be packaged in a fraction of the size, as compared to linear regulators.

Conventional buck converters, as depicted in FIG. 1, often can include one or more switches, which can be implemented by MOSFETs (Metal-Oxide-Semiconductor-Field-Effect-Transistors). The switches, which are commonly controlled by a multiphase oscillator, can alternate between connecting and disconnecting a voltage source to circuits that drive the desired output. Hence, the duty cycle of the switching determines the output voltage. In addition, a pulse-width modulation (PWM) circuit commonly controls the switching with each switch receiving a different phase of the PWM over the complete period of the oscillator frequency.

Typically, buck converters are useful, and frequently used, in high current applications, for instance, high power microprocessors, Pentium® II applications, Pentium® III applications, notebook computers, desktop computers, network servers, large memory arrays, workstations, DC power distribution systems, and the like. These applications usually require from 10 Amperes (A) to 300 A of current.

Buck converters can include multiple parallel channels to process one or more of the voltage sources to drive a common output. Each channel can be substantially similar and often includes at least one inductor. The input terminal of the inductor is switched between the voltage source and ground.

The DC current through each inductor is proportional to the duty cycle of its PWM signal and the value of the voltage source. Each inductor has a current limit. Typically, more PWM circuits are used when more output current is desired. The output terminals of all the inductors are electrically connected to provide a single output of the power conversion circuit.

The output terminals of all the inductors are tied together and therefore have at least approximately identical voltages. The input terminal of each inductor has a rectangular wave voltage signal, which is derived from the voltage source and ground. The duty cycles of the rectangular wave voltage signals of respective channels are affected by variations in the respective PWM circuits and switches (e.g., design tolerances, offsets, and timing variations). A slight difference in the duty cycle can produce a significant difference in the DC current through the inductor in each channel.

In a multiphase buck converter arrangement, the PWM circuit can provide a variable duty cycle signal to control the switching of each channel. The PWM channels are synchronous with different phases for each channel. Thus, the PWM channels enable each channel to be switched on a different time. The multiple phases increase an output ripple frequency above the fundamental channel switching frequency. Additionally, the input ripple current is reduced, thereby significantly reducing the input and output capacitors, which can tend to be large and expensive.

High efficiency power conversion circuits typically use inductors with low core loss (e.g., ferrite inductors). When the peak design current is exceeded (i.e., saturation), the inductance of ferrite core material collapses abruptly, which results in an abrupt increase in inductor ripple current and output voltage ripple. Thus, it is important to keep the inductor core from saturating. Prior art systems sense the current in each channel and adjust the respective duty cycles to produce the same current for each channel.

An exemplary prior art device is the Texas Instruments® high-frequency, multi-phase controller, i.e., Part No. TPS40090. This controller employs a peak current mode control scheme, which naturally provides a certain degree of current balancing. With current mode control, the level of current feedback should comply with certain guidelines depending on a duty factor, known as slope compensation, to avoid sub-harmonic instability. This requirement can prohibit achieving a higher degree of phase current balance. To avoid the problem, a separate loop that forces phase currents to match is added to the control scheme. This effectively provides a high degree of current sharing independent of properties of a small signal response of the controller. Indeed, high-bandwidth current amplifiers can accept as an input voltage either current-sense resistors, a DCR voltage of an inductor (the inherent resistance in the metal conductor of an inductor) derived by a resistor/capacitor network, or thermally compensated voltage derived from the DCR, DC resistance, of the inductor. This device is limited to four phases and uses a resistive divider to set output voltage.

Another exemplary prior art device is the Intersil® microprocessor CORE voltage regulator precision multi-phase BUCK PWM controller for mobile applications, i.e., Part No. ISL6219A. A benefit of multiphase operation is the thermal advantage gained by distributing the dissipated heat over multiple devices and a greater area. By implementing more than one device, the complexity of driving multiple parallel and the expense of using expensive heat sinks and exotic magnetic materials are avoided. To fully realize the thermal advantage, it is important that each channel in a multiphase converter be controlled to deliver about the same current at many load levels. Intersil® multiphase controllers attempt to guarantee current balance by comparing each current channel to the over-current delivered by all channels and, accordingly, making an appropriate adjustment to each pulse width channel based on this error. The Intersil® device is limited to a three phase arrangement and uses external resistor dividers.

What is needed is a power conversion system, e.g., a buck converter, which can lower an input voltage down to a lower voltage without external resistor dividers. Moreover, a comprehensive and complete buck converter without external resistor dividers and external FETs is needed, which is capable of both a single phase and a multiphase arrangement. It is to such a device and system that the present inventions is directed.

SUMMARY

The present invention is a power conversion system. More specifically, the present invention is an integrated field emitting transistor synchronous multiphase buck converter having, among other things, an innovative oscillator. The buck converter can convert input voltages ranging from 3 Volts (V) to 5V down to a lower voltage without resistor dividers.

The present buck regulator uses an oscillator to enable multiphase operation (preferably, up to 10 buck converters) and, thus preferably, can create up to 60 A of output current. The multiphase operation can reduce the size of the inductors and bulk capacitors. Moreover, the multiphase operation can yield higher efficiency, and provide the required transient response for demanding applications, than provided in conventional devices. The output current is sensed by a transistor in available power stages. The power stages can comprise a high side and a low side transistor, nonoverlap clock generator and level shifter, and buffers, which are integrated in the buck converter to enable fast transient response and also to achieve accurate forced current sharing.

A high side MOSFET implements a bootstrap capacitor to provide an upper drive voltage over the input voltage. The oscillator of the buck converter includes three pins—CLKIN, CLKOUT, and SYNC—which control the frequency and modes of operation. In a single-phase operation CLKIN is connected to Vdd and the frequency is determined by an external resistor and capacitor; alternatively, it can be determined by a force on the external clock signal at the SYNC pin.

In multiphase operation, one of buck converters can be considered the master and the remaining buck converters considered the slaves. The oscillators of each buck converter communicate with each other, and thereby produce a multiphase clock signal for PWM switching without requiring control integrated circuits. During the multiphase operation, the buck converters can produce out-of-phase clocks by using various voltage references and special sequencing in starting-up the buck converter while limiting number of pins.

The master buck converter is the last device that comes out from a shut down state and it can be preset by an edge of its own shut down signal, as well as the high level of clock signal that can circulate between the chips.

These and other objects, features, and advantages of the present invention will become more apparent upon reading the following specification in conjunction with the accompanying drawings.

DETAILED DESCRIPTION OF THE DRAWINGS

Figure 1:
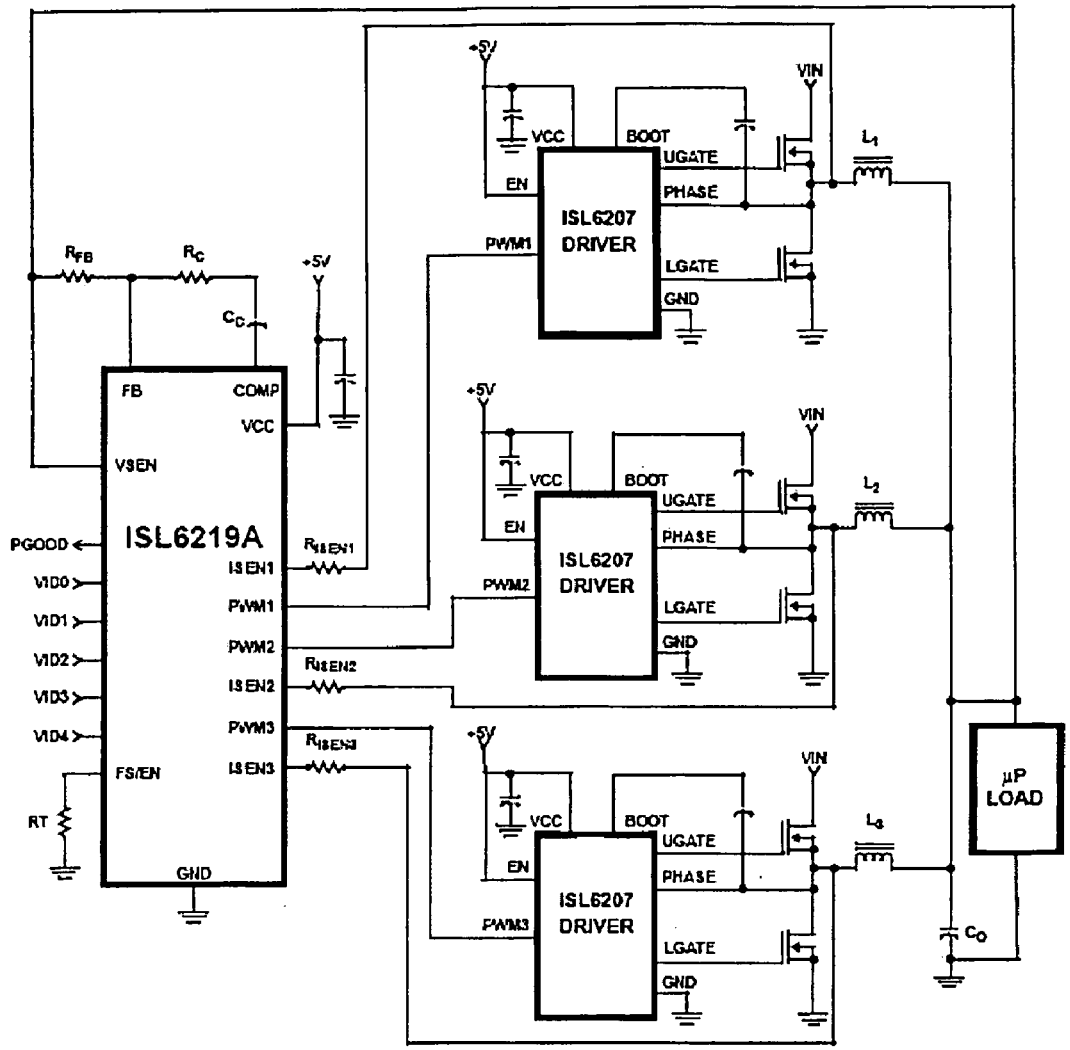
FIG. 1 illustrates a prior art buck converter device included in a controller circuit.
Figure 2A:
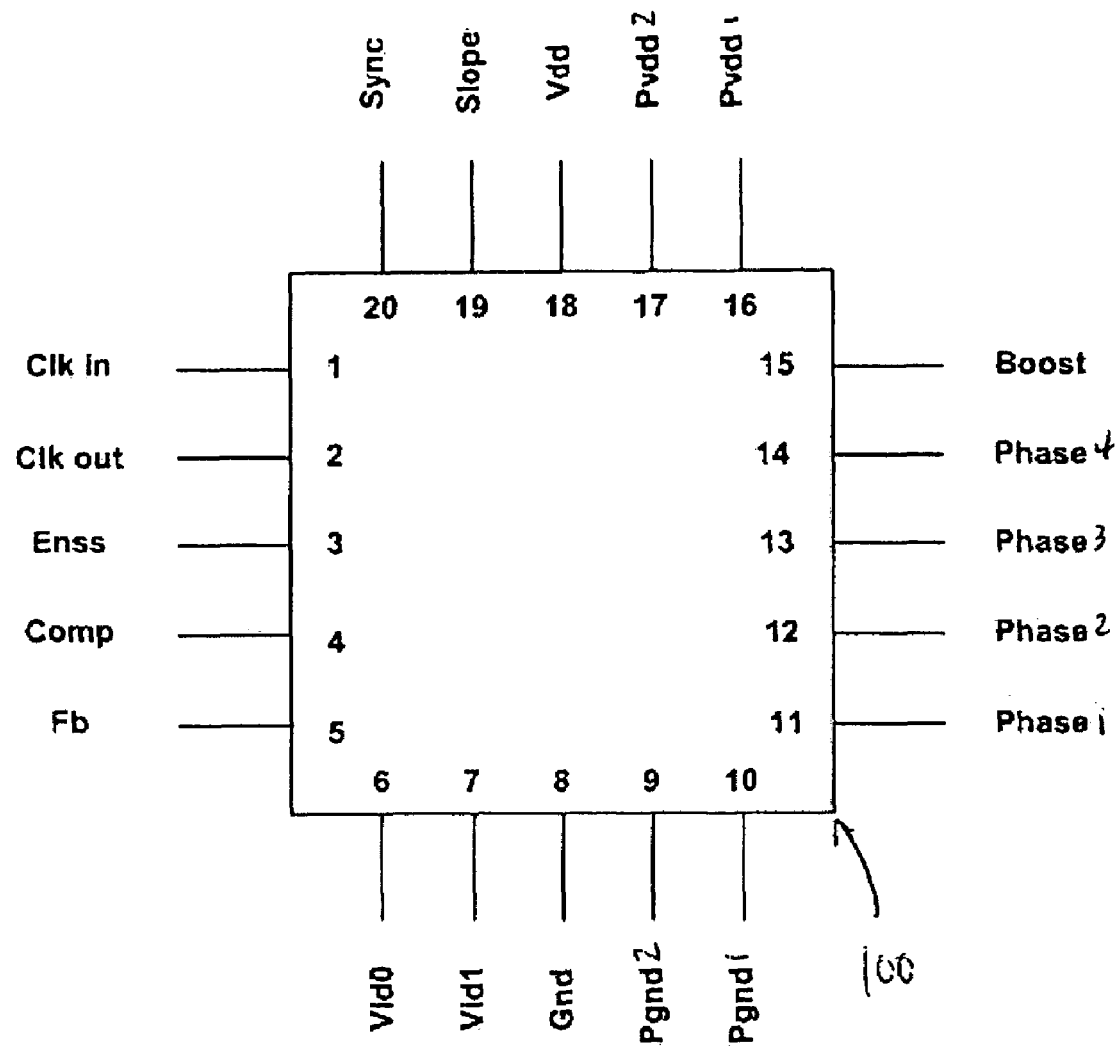
FIG. 2A illustrates the pin out of a buck converter in accordance with a preferred embodiment of the present invention.

Referring now in detail to the drawing figures, wherein like references represent like parts throughout the several views, FIG. 2A illustrates a buck converter 100.

The present invention is an improved power conversion system, or a power synchronous buck regulator 100 for converting input voltage, preferably, without the need or use of external resistor dividers. The input voltage selects an output setting for flexibility and accuracy.

FIG. 2A illustrates the pin outs of the buck converter 100. In a preferred embodiment, the buck converter 100 includes twenty (20) pins. Although, one skilled the art will recognize that the buck converter 100 can be packaged with more or less pins. Indeed, in a preferred embodiment the buck converter is packaged in a 20-pin MLPQ (Micro Leadframe Package Quad) package. One skilled in the art will also appreciate that the buck converter 100 can be packaged in a different package.

Typical applications that can use the buck converter 100, include, but are not limited to: distributed power systems, point of use power systems, communication infrastructures, DDR memory and bus termination, Vcore for demanding microprocessors and application specific integrated circuits (ASICs), and the like.

Table 1 illustrates a description of the preferred pin-outs of the buck converter 100.

TABLE 1

| Pin Name | Pin Number | Pin Function |
| --- | --- | --- |
| CLKIN | 1 | Input clock |
| CLKOUT | 2 | Output clock |
| ENSS | 3 | Soft start and enable |
| COMP | 4 | Error amplifier output |
| FB | 5 | Inverting input of error amplifier |
| Vid0 | 6 | Output voltage identifier |
| Vid1 | 7 | Output voltage identifier |
| GND | 8 | Ground |
| PGND2 | 9 | Power ground |
| PGND1 | 10 | Power ground |
| PHASE1 | 11 | Phase output |
| PHASE2 | 12 | Phase output |

TABLE 1-continued

| Pin Name | Pin Number | Pin Function |
|---|---|---|
| PHASE3 | 13 | Phase output |
| PHASE4 | 14 | Phase output |
| BOOST | 15 | Bootstrap output |
| PVdd1 | 16 | Power supply for power stage |
| PVdd2 | 17 | Power supply for power stage |
| Vdd | 18 | Power supply for signal section |
| SLOPE | 19 | Voltage slope |
| SYNC | 20 | External clock |

The buck converter 100 in a preferred embodiment can convert input voltage ranging from approximately 3V to approximately 5V down to approximately 0.7V-1.0V, 1.2V, 1.5V, 1.8V, 2.5V, and 3.3V. The conversion is accomplished without the use of resistor dividers.

Depending on what is connected to the input voltage, i.e., the Vid0 and Vid1 pins, the output voltage can be selected. Table 2 identifies the output voltage selection codes, wherein "F" refers to float, "1" refers to Vdd, and "0" refers to ground. The output voltages identified in Table 2 are preferred approximate values.

TABLE 2

| Vid0 | Vid1 | Output Voltage |
|---|---|---|
| 0 | 0 | 0.7 |
| 0 | 1 | 0.8 |
| 0 | F | 0.9 |
| 1 | 0 | 1.0 |
| 1 | 1 | 1.2 |
| 1 | F | 1.5 |
| F | 0 | 1.8 |
| F | 1 | 2.5 |
| F | F | 3.3 |

In a preferred embodiment, the operating conditions of the buck converter 100 are known. For instance, Vdd is, at a minimum, approximately 3V and, at a maximum, approximately 5.5V. Additionally, PVdd1 and PVdd2 are, at a minimum, approximately 3V and, at a maximum, approximately 5.5V. The operating junction temperature is, preferably, between approximately 0° Celsius and 125° Celsius.

In an exemplary embodiment, the buck converter 100 includes preferred electrical specifications; Table 3 includes these specifications. These specifications are preferred limits in applying a junction temperature of 25° C., while the limits identified in bold apply over the entire junction temperature range for operation, i.e., 0° C. to 125° C. The specifications listed in Table 3 are approximate values.

TABLE 3

| Parameter | Conditions | Min. | Typ. | Max. | Units |
|---|---|---|---|---|---|
| Vid Pins interface | | | | | |
| H level Input Voltage (VIH) | | 0.9*Vdd | | | V |
| L level Input Voltage (VIL) | | | | 0.1*Vdd | V |
| H level Leak Current (IIH) | Vid = Vin | | | 40 | uA |
| L level Leak Current (IIL) | Vid = Gnd | −40 | | | uA |
| Power Supply | | | | | |
| Voltage range, Pvdd | | 3.0 | | 5.5 | V |
| Voltage range, Vdd | | 3.0 | | 5.5 | V |
| Quiescent current (from Vdd) | | | 12.0 | 20 | mA |
| UVLO Levels | | | | | |
| Start threshold voltage (Vdd & Pvdd) | | 2.4 | 2.7 | 3.0 | V |
| Stop threshold voltage (Vdd & Pvdd) | | 2.2 | 2.5 | 2.8 | V |
| Reference voltage | | | | | |
| Reference Output Voltage | | | 0.7 | | V |
| Vout 0.7 V | Iout = 100 mA, Vdd = 5, Tj = 25° C. 0 < Iout < 6A, 3 < vdd < 5.5 | 0.686 0.679 | 0.7 | 0.714 0.721 | V |
| Vout 0.8 V | Iout = 100 mA, Vdd = 5, Tj = 25° C. 0 < Iout < 6A, 3 < vdd < 5.5 | 0.784 0.776 | 0.8 | 0.816 0.824 | V |
| Vout 0.9 V | Iout = 100 mA, Vdd = 5, Tj = 25° C. 0 < Iout < 6A, 3 < vdd < 5.5 | 0.882 0.873 | 0.9 | 0.918 0.927 | V |
| Vout 1.0 V | Iout = 100 mA, Vdd = 5, Tj = 25° C. 0 < Iout < 6A, 3 < vdd < 5.5 | 0.980 0.970 | 1.0 | 1.020 1.030 | V |

TABLE 3-continued

| Parameter | Conditions | Min. | Typ. | Max. | Units |
|---|---|---|---|---|---|
| Vout 1.2 V | Iout = 100 mA, Vdd = 5, Tj = 25° C. 0 < Iout < 6A, 3 < vdd < 5.5 | 1.207 1.164 | 1.2 | 1.224 1.236 | V |
| Vout 1.5 V | Iout = 100 mA, Vdd = 5, Tj = 25° C. 0 < Iout < 6A, 3 < vdd < 5.5 | 1.470 1.455 | 1.5 | 1.530 1.545 | V |
| Vout 1.8 V | Iout = 100 mA, Vdd = 5, Tj = 25° C. 0 < Iout < 6A, 3 < vdd < 5.5 | 1.764 1.746 | 1.8 | 1.836 1.854 | V |
| Vout 2.5 V | Iout = 100 mA, Vdd = 5, Tj = 25° C. 0 < Iout < 6A, 3 < vdd < 5.5 | 2.450 2.425 | 2.5 | 2.550 2.575 | V |
| Vout 3.3 V | Iout = 100 mA, Vdd = 5, Tj = 25° C. 0 < Iout < 6A, 3 < vdd < 5.5 | 3.234 3.201 | 3.3 | 3.366 3.399 | V |
| Regulation | | | | | |
| Line regulation | IL = 0.5 A, fs = 400 kHz | | 0.2 | 0.5 | % |
| Line regulation | IL = 0.5 A, fs = 500 kHz | | 0.2 | 0.5 | % |
| Load regulation | IL = 0 to 6 A, fs = 400 kHz | | 0.35 | 0.8 | % |
| Load regulation | IL = 0 to 6 A, fs = 500 kHz | | 0.35 | 0.8 | % |
| Oscillator | | | | | |
| Frequency setting via external R, C | | | 1 | | MHz |
| External clock threshold | | 0.9*vdd | | vdd | V |
| Ramp amplitude (peak-to-peak) | | | 1.6 | | V |
| Error amplifier | | | | | |
| Error amplifier open loop voltage gain | | | 100 | | dB |
| Error amplifier unity gain bandwidth | | | 6 | | MHz |
| Enable | | | | | |
| Enable threshold voltage, enss (single phase) | chip is shutdown under specified level | | | 0.5 | V |
| Current limit | | | | | |
| Current limit trip point | pvdd = 3 | | 10 | | A |
| Current limit trip point | pvdd = 5 | | 12 | | A |
| Thermal shutdown | | | | | |
| Thermal shutdown trip point | | | 150 | | ° C. |
| Thermal shutdown hystersis | | | 30 | | ° C. |
| Output Power MOSFETS | | | | | |
| Power MOSFET switches rds(on) | pvdd = 3 | | 25 | | mΩ |
| Power MOSFET switches rds(on) | pvdd = 5 | | 20 | | mΩ |

Figure 2B:
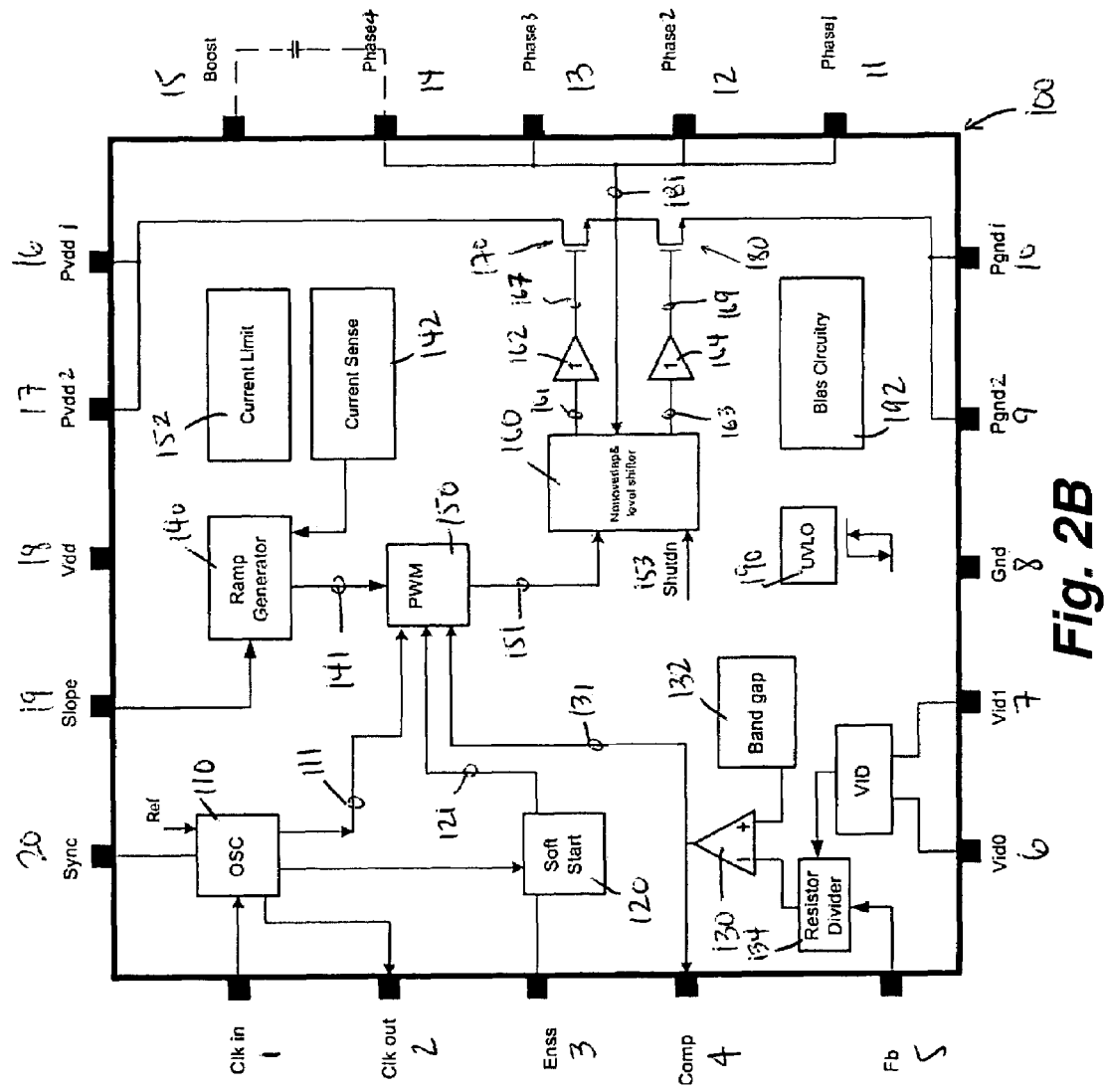
FIG. 2B illustrates a circuit diagram of the buck converter, in accordance with a preferred embodiment of the present invention.

Referring now to FIG. 2B, a preferred embodiment of the internal components of the buck converter or regulator 100 is illustrated. The buck converter 100 can comprise an oscillator 110, a soft start circuit 120, an error amplifier 130, a ramp generator 140, a pulse width modulator 150, and a nonoverlap clock generator and level shifter 160.

The buck converter 100 is powered with Vdd and is grounded at GND.

The oscillator 110, which is identified as OSC, is in communication with the CLKIN and CLKOUT pins, soft start circuit 120, pulse width modulator 150, and the SYNC pin. CLKIN provides a clock signal to the buck converter 100. The oscillator 110 can, in a multiphase mode, utilize the CLKOUT pin to distribute the clock signal to another buck converter 100. An output of the oscillator 110 is a signal 111. Additionally, the oscillator 110 is in communication with a soft start circuit 120. The oscillator 110 is an electric circuit that creates a particular frequency based on its environment.

The soft start circuit 120 is in communication with the ENSS pin and the pulse width modulator 150. The output of the soft start circuit 120 is a signal 121. ENSS provides accurate soft starts and enables functionality for smooth start and voltage sequencing.

An error amplifier 130 is further included in the buck converter 100. When a loop of the error amplifier 130 is settled then the two inputs of the error amplifier 130 can become equal. Accordingly, a band gap circuit 132 outputs a voltage of approximately 0.7V. The band gap circuit 132 enables generation of an accurate voltage at the output of the buck converter 100 with current capability; indeed, preferably, the voltage can exhibit little dependence on temperature. Hence, the band gap circuit 132 can produce a temperature independent reference. The band gap circuit 132 can develop a reference having a nominally zero temperature coefficient, wherein the voltage of the band gap circuit 132 is trimmed within an accuracy of 1%. In the single phase mode, wherein an external resistor divider is not used, the FB pin can be connected to the output of the error amplifier 130. Once Vid0 and Vid1 are set, a coefficient of an internal resistor divider 134 can change, which leads to the appropriate output, based on Table 2. The internal resistor divider 134 can be used for setting the nine different output settings. By using the internal resistor divider 134, external resistor dividers can be removed, providing a more accurate buck converter. Additionally, by implementing the internal resistor divider 134, the different outputs can be set. Yet, if other voltages (other than those described) are needed, an external resistor divider can be implemented. The result of the error amplifier 130 is a signal 131.

Figure 3:
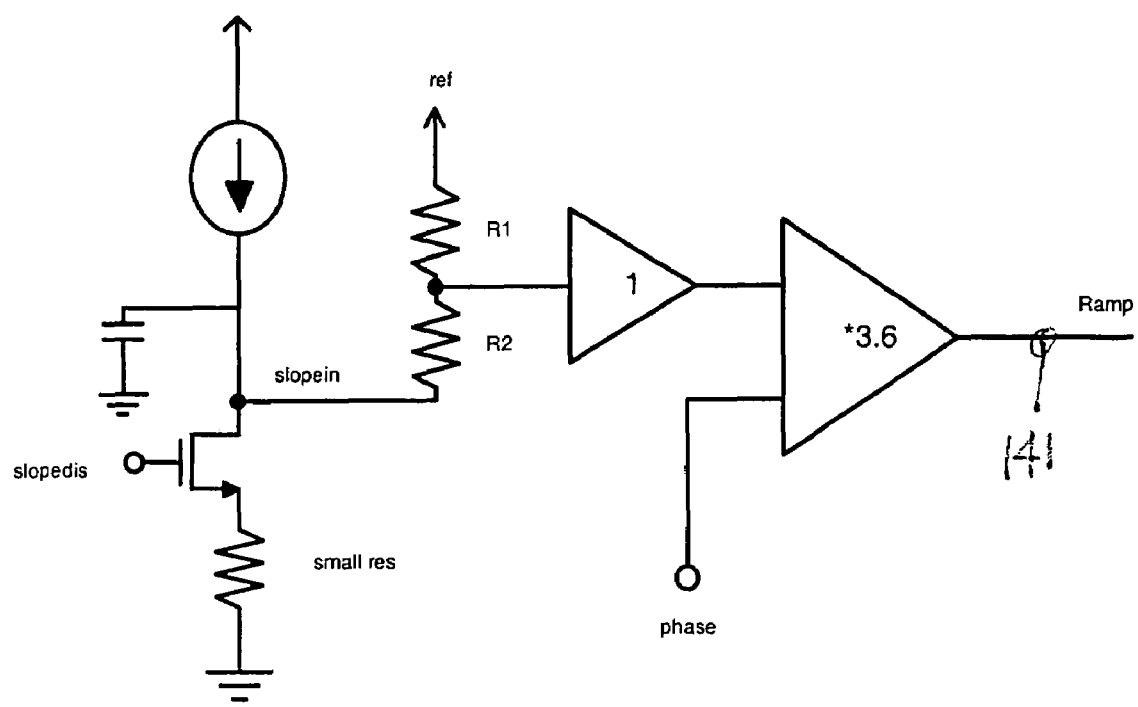
FIG. 3 illustrates a circuit diagram of a ramp generator, in accordance with a preferred embodiment of the present invention.

A ramp generator 140 is in communication with a current sense circuit 162, and the SLOPE pin. An exemplary ramp generator is illustrated in FIG. 3. The ramp generator 140 can amplify, or ramp up, the given signal.

Referring back to FIG. 2B, in a preferred embodiment the current sense circuit 142 is connected to the drain and source of a top switch 170 and senses the current of output. As a result, the current can be added to the SLOPE pin voltages with a DC level, and produces a main ramp of the pulse width modulator 150. The result of the ramp generator 140 is a signal 141.

The pulse width modulator 150 is driven by signals 111, 121, 131, and 141, from the oscillator 110, the soft start circuit 120, the error amplifier 130, and the ramp generator 140, respectively. The pulse width modulator 150 can hold the frequency constant while the width of the power pulse is varied, and controls both line and load changes without major dissipation. The result, which is a signal 151 of the pulse width modulator 150, is communicated to the nonoverlap clock generator and level shifter 160. The pulse width modulator 150 can also includes a current limit circuit 152.

Figure 4:
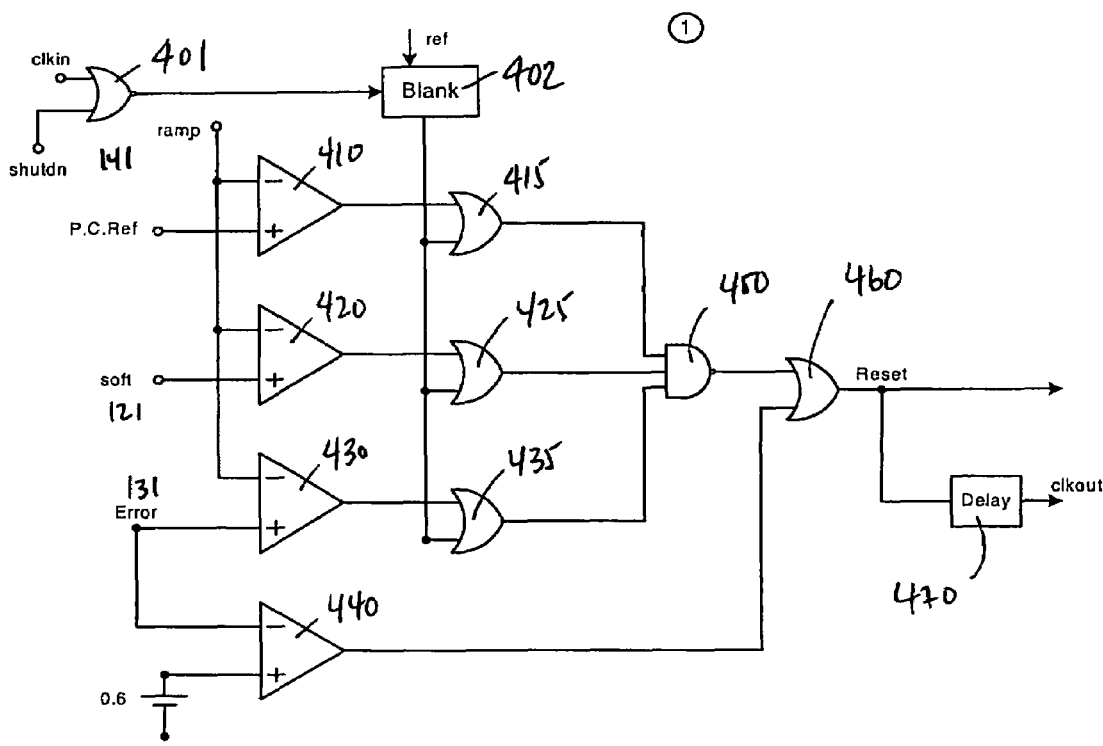
FIG. 4 illustrates a circuit diagram of a pulse width modulator, in accordance with a preferred embodiment of the present invention.

FIG. 4 illustrates a preferred embodiment of the pulse width modulator 150. CLKIN and shutdn signals are fed into a NOR gate 401. The result of the NOR gate 401 is fed into a Blank circuit 402. The Blank circuit 402 can cancel the transient time at the beginning of each clock cycle. The Blank circuit 402 is fed also with a REF signal, which is the reference voltage. A ramp signal feeds three comparators 410, 420, and 430. The ramp signal 141 from the ramp generator 140 and P.C. ref signal are fed into the comparator 410. Also, the ramp signal 141 and the signal from the soft start 120, or the signal 121, are fed into the comparator 420. The ramp signal 141 and the signal from the error amplifier 130, or the signal 131, are fed into the comparator 430. The signal 131 and a 0.6V reference are fed into a comparator 440.

In addition, the result of the Blank circuit 402 and the result of the comparators 410, 420, and 430 are fed into OR gates 415, 425, and 435 respectively. The results of OR gates 415, 425, and 435 are fed into a NAND gate 450. The result of the NAND gate 450 and the result of comparator 440 are fed into an OR gate 460. The result of the OR gate 460 creates a Reset signal to be fed out, while some of the Reset signal is fed into a Delay circuit 470 to be fed to the CLKOUT.

Referring back to FIG. 2B, although not depicted as being connected, the current limit circuit 152 can be connected to the pulse width modulator 150, wherein the ramp signal is compared to a reference voltage; if the ramp signal reaches a particular voltage, then the current must be limited, whereby the pulse width modulator 150 can lock clock signals. Moreover, the pulse width modulator 150 generates the main clock for a pair of switches 170 and 180, after passing through the nonoverlap clock generator and level shifter 160 and buffer blocks 162 and 164.

The PHASE pins—PHASE1, PHASE2, PHASE3, and PHASE4—are outputs of the buck converter 100. External to the buck converter 100, PHASE4 has a capacitor in communication with BOOST. The PWM signal, which is generated at PWM output 151, passes through the nonoverlap clock generator and level shifter 160, a digital buffer 162, a digital buffer 164, a MOSFET 170 and a MOSFET 180 to produce the high current capability PWM at the phase node.

The nonoverlap clock generator and level shifter 160 is in communication with the signal 151, and a shutdn signal 153. There are two output switches in the buck converter 100 that shall not turn on simultaneously, thus enabling the clock signal of the PWM to pass through the nonoverlap clock generator and level shifter 160 to generate a nonoverlap clock that can be applied to the power switches. The nonoverlap clock generator and level shifter 160 can produce two signals 161 and 163. A digital buffer 162 receives the signal 161 to drive the switch 170 with signal 167. Additionally, the digital buffer 164 receives the signal 163 to drive the switch 180 with signal 169.

PVdd1 and PVdd2 are combined to enter the drain of the switch 170. At the gate of the large power switch 170 is signal 167. The resulting source of the switch 170 is in communication with signal 181 of PHASE1, PHASE2, PHASE3, and PHASE4, and the drain of switch 180. The integrated switches 170 and 180, each a MOSFET, eases the use of the buck converter 100 by helping limit, if not eliminating, external passive components.

The switch 180 is in communication with signal 169 at its gate, and with PGND1, PGND2 at drain, and signal 220 at the source of the transistor 180.

The buck converter 100 further includes an undervoltage lockout circuit 190, which continues to monitor the voltage of the buck converter 100, and bias circuitry 192. The bias circuitry 192 can produce a current from the band gap circuit 132 as a reference to generate required current.

PHASE1, PHASE2, PHASE3, and PHASE4 are the phase output of the buck converter 100. Additionally BOOST is the bootstrap output of the buck converter 100.

Figure 5:
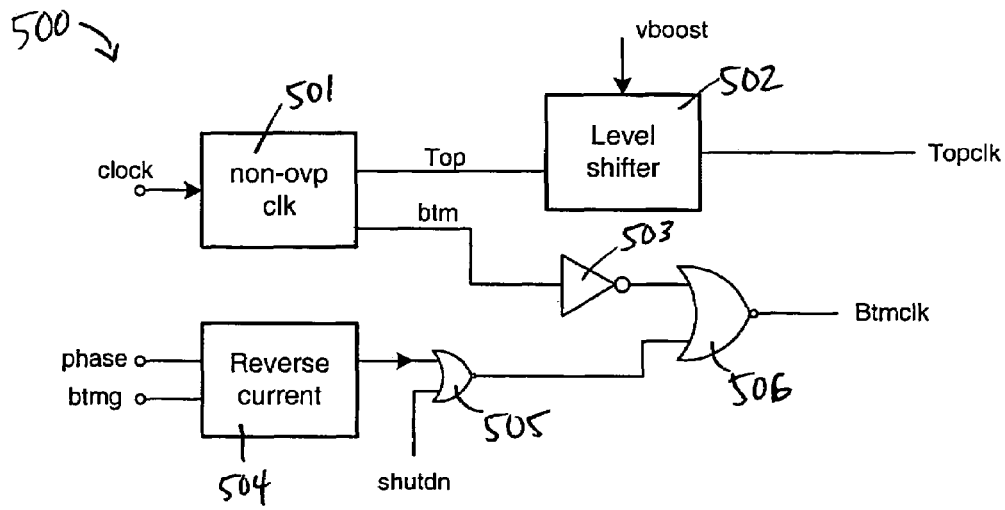
FIG. 5 illustrates a circuit diagram of a power stage circuit, in accordance with a preferred embodiment of the present invention.

FIG. 5 illustrates a circuit diagram of a power stage control 500. The CLK signal is inserted into the non-ovp clk, which is a non-overvoltage protection clock 501. The clock 501 produces top and btm signals. The top signal is fed into a level shifter 502, while the btm signal is fed into a NOT gate 503. The resulting signal from the level shifter 502 is topclk, which can be fed to the oscillator 110. A reverse current circuit 504 can receive a phase and btmg signal. The result of the reverse current circuit 504 and shutdn is fed into a NOR gate 505. The signal from the NOT gate 503 and the signal from the NOR gate 505 is fed into a NOR gate 506, which results in to btmclk signal, which can be fed to the oscillator 110

Figure 6:
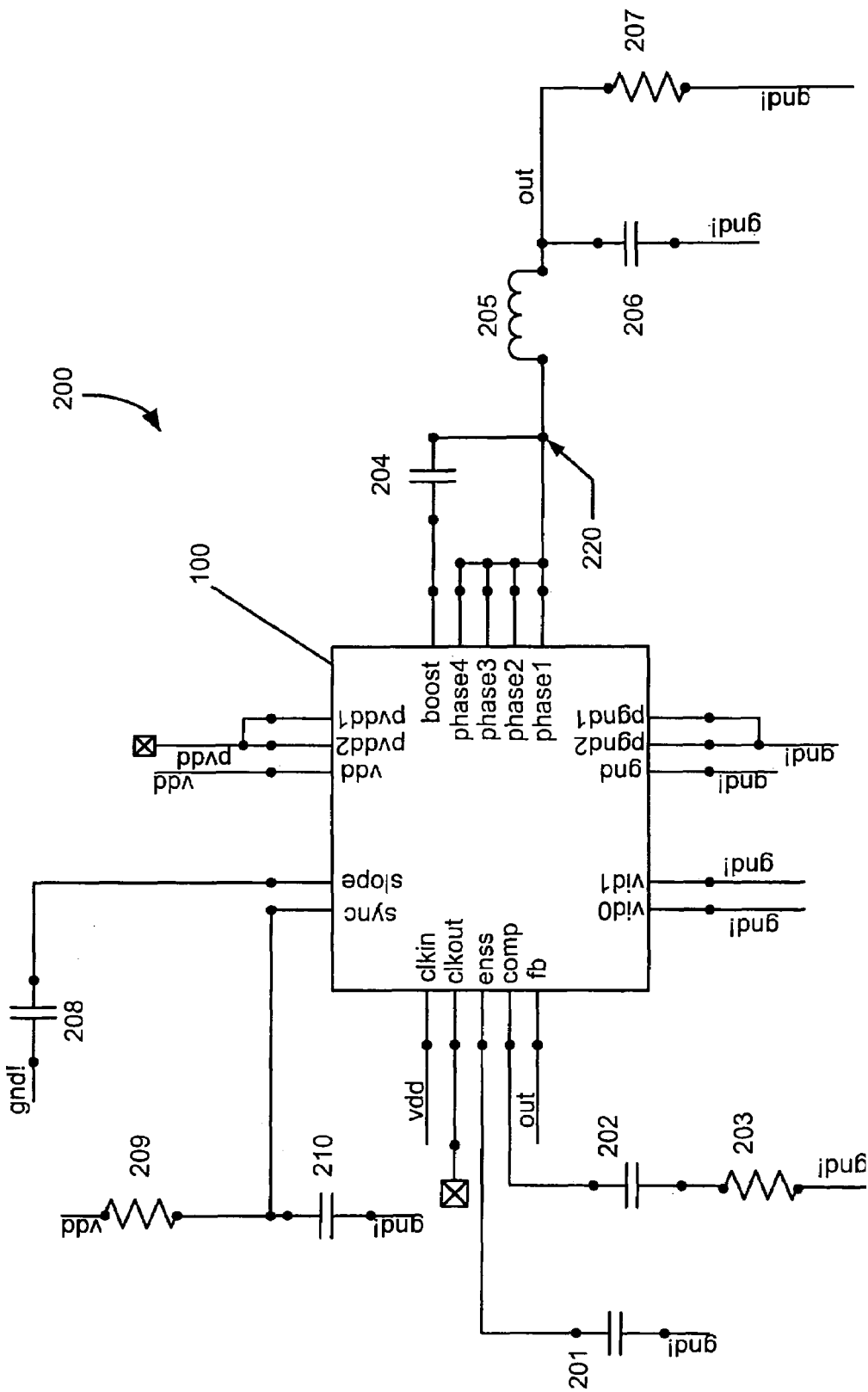
FIG. 6 illustrates a circuit diagram of the buck converter in a single phase mode, in accordance with a preferred embodiment of the present invention.

Referring now to FIG. 6, the buck converter 100 is illustrated in a preferred embodiment of a single phase mode circuit 200, i.e., there is only one buck converter 100 in the circuit.

In this mode 200, the CLKIN is pulled to Vdd, and the frequency of the mode 200 is set by a resistor 209 and capacitor 210. The oscillator 110 produces a sawtooth signal at the SYNC pin. Frequency can be set by an external resistor and capacitor pair, or it can be forced by an external TTL (transistor to transistor logic) clock, but not both.

CLKIN is connected to Vdd. Since there is only one buck converter 100, the CLKOUT pin does not connect to anything; hence, it is floating. The ENSS pin is connected to a capacitor 201 and then to ground. In a preferred embodiment, the capacitor 201 can be approximately 10 nanoFarads (nF). The COMP pin is connected to a capacitor 202 and a resistor 203, and then to ground. In a preferred embodiment, the capacitor 202 can be approximately 33 nF and the resistor 203 can be approximately 1.8 kiloOhms (kΩ). FB is connected to the output of the mode 200.

The user can select the Vid pin setting—for Vid0 and Vid1—based on Table 2 for setting the output voltage. Additionally, GND, PGND1 and PGND2 are preferably connected to ground in the single mode 200.

In the single mode 200, PHASE1, PHASE2, PHASE3, and PHASE4 are connected to each other. Additionally, BOOST is in communication with a capacitor 204 and the PHASE1, PHASE2, PHASE3, and PHASE4 resulted signals. In a preferred embodiment, the capacitor 204 can be approximately 100 nF.

A signal 220 of PHASE1, PHASE2, PHASE3, and PHASE4 and BOOST connects to an inductor 205. In a preferred embodiment, the inductor 205 can have an inductance of approximately 1 microHenrys (uH). The inductor 205 is in series with a capacitor 206 and a resistor 207, both of which are thereafter connected to ground. In a preferred embodiment the capacitor 206 is approximately 500 uH. The resistor 207 can control the load current, which can be up to 6 A.

In addition, Pvdd1 and Pvdd2 can be tied together and connected the PVdd source, which supplies the power section, while Vdd is connected to the Vdd source. The SLOPE pin is connected to a capacitor 208, which is connected to ground. In a preferred embodiment, the capacitor 208 is approximately 250 picoFarads (pF).

Moreover, the SYNC pin is connected to resistor 209 and capacitor 210, wherein thereafter resistor 209 is connected to Vdd and capacitor 210 is connected to ground. In a preferred embodiment, the resistor 209 is approximately 5 kΩ and the capacitor 210 is approximately 270 nF.

Figure 7:
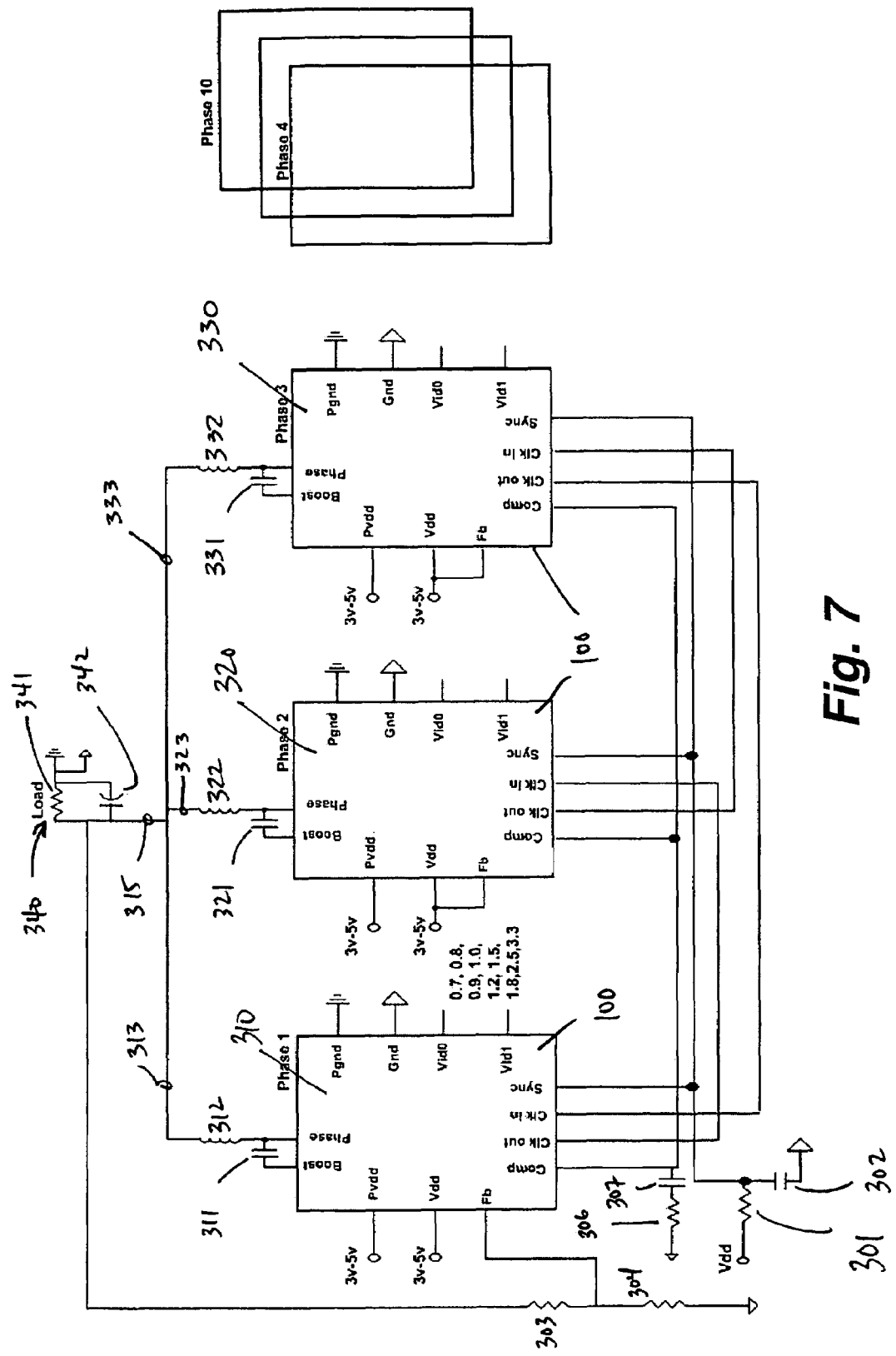
FIG. 7 illustrates a circuit diagram of the buck converter in a multiphase mode, in accordance with a preferred embodiment of the present invention.

As illustrated and disclosed in FIG. 6, the buck converter 100 can operate in a single mode 200, but the buck converter 100 can further adapted to operate in a multiphase mode 300. Referring now to FIG. 7, the buck converter 100 is illustrated in a multiphase operating mode 300. Indeed, preferably, up to 10 buck converters 100 enabling from 6 amps (A) to 60 A output currents. Depending on the desired processing speed, maximum frequency and output current, the number of buck converters 100 can increase or decrease. One skilled in the art will appreciate that the number of buck converters 100 in a multiphase mode 300 is dependent on the desired processing speed and oscillator frequency.

The multiphase operating mode 300 comprises at least two buck converters 100. FIG. 7 illustrates three buck converters 100 connected, but further illustrates that up to ten buck converters 100 can be connected in the multiphase circuit 300. Indeed, buck converter 310, buck converter 320 and buck converter 330 reference the three different buck converters 100 depicted.

The multiphase operating mode 300 has an inherent thermal sharing among the phases. The operating frequency of the multiphase mode 300 is up to approximately 1 MHz per phase. The multiphase 300 include an output identifier of approximately 0.7-1.0V, 1.2V, 1.5V, 1.8V, 2.5V and 3.3V, wherein preferably the buck converter 100 produces an accuracy of within 1% of reference.

The following description of the multiphase 300 is a preferred embodiment; one skilled in the art will appreciate other embodiments. The PVdd1 and PVdd2 pins of buck converter 310 are sourced with approximately 3V to approximately 5V of voltage. Also, Vdd of buck converter 310 is sourced with approximately 3V to approximately 5V.

The Vdd source is connected to resistor 301. The resistor 301 is in parallel with SYNC of buck converter 310, SYNC of buck converter 320, SYNC of buck converter 330, and capacitor 302. The capacitor 302, thereafter, is connected to a ground.

CLKIN of buck converter 310 is connected to CLKOUT of buck converter 330. Also, CLKOUT of buck converter 310 is connected to CLKIN of buck converter 320. CLKOUT of buck converter 320 is connected to CLKIN of buck converter 330.

Each buck converter 310, 320 and 330 has a capacitor 311, 321, and 331 connected to BOOST. BOOST connects to the PHASE1, PHASE2, PHASE3, and PHASE4 pins. The result of this connection enters an inductor 312, 322, and 332. After the inductor, the three signals 313, 323, and 333 combine to create signal 315. The signal 315 is electronically parallel with a load 340. The load 340 includes a resistor 341 and capacitor 342 and can be connected to ground.

The load 340 is connected to a resistor 303. The resistor 303 is electrically parallel with resistor 304, and pin FB. The resistor 304 is tied to ground.

A resistor 306 is in series with a capacitor 307 are tied to COMP pins of all the buck converters 310, 320, and 330 of the multiphase mode 300.

Figure 8:
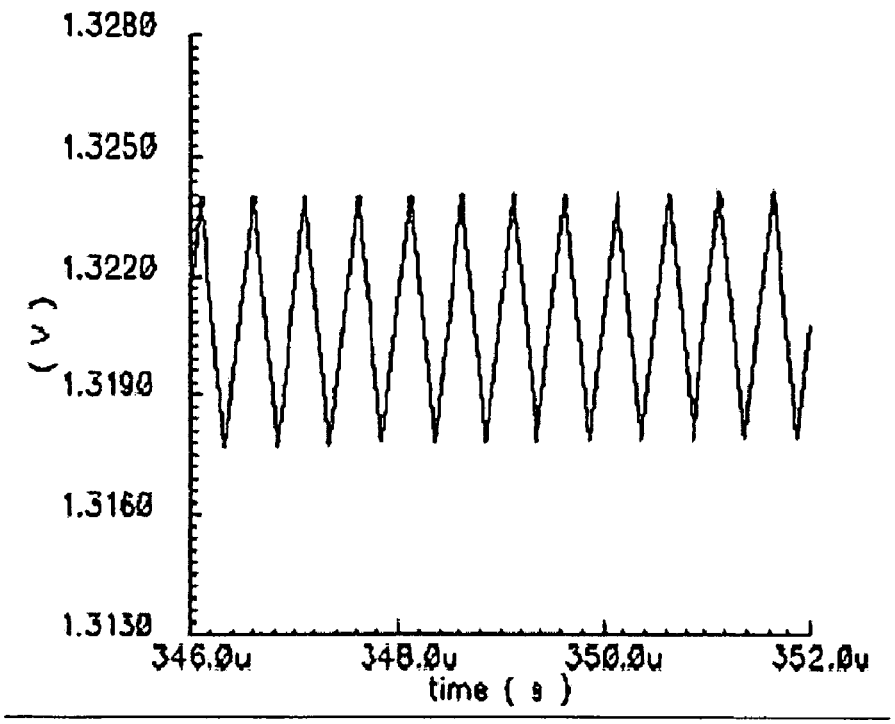
FIG. 8 illustrates a graphical representation of output voltage in regulation having known passive elements, in accordance with a preferred embodiment of the present invention.
Figure 9:
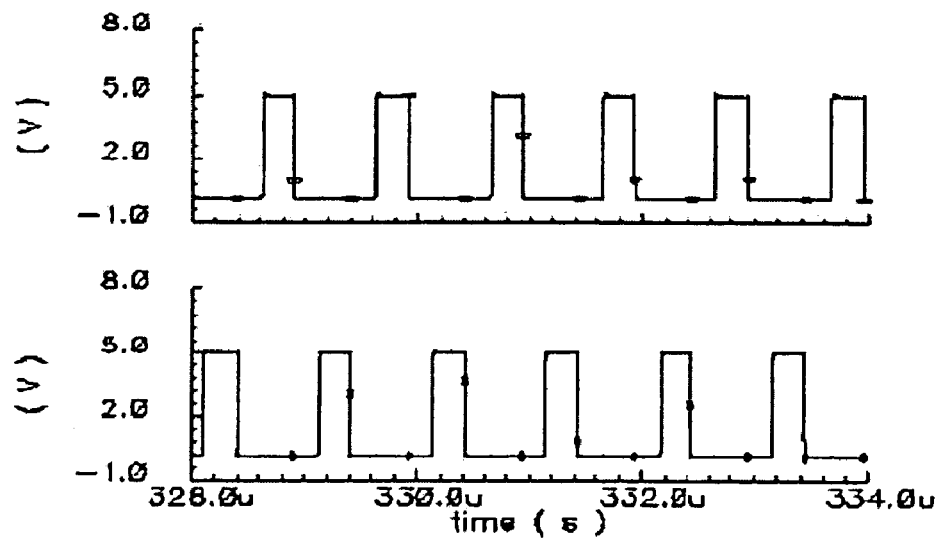
FIG. 9 illustrates a graphical representation of a two-phase clock in multiphase mode, in accordance with a preferred embodiment of the present invention.
Figure 10:
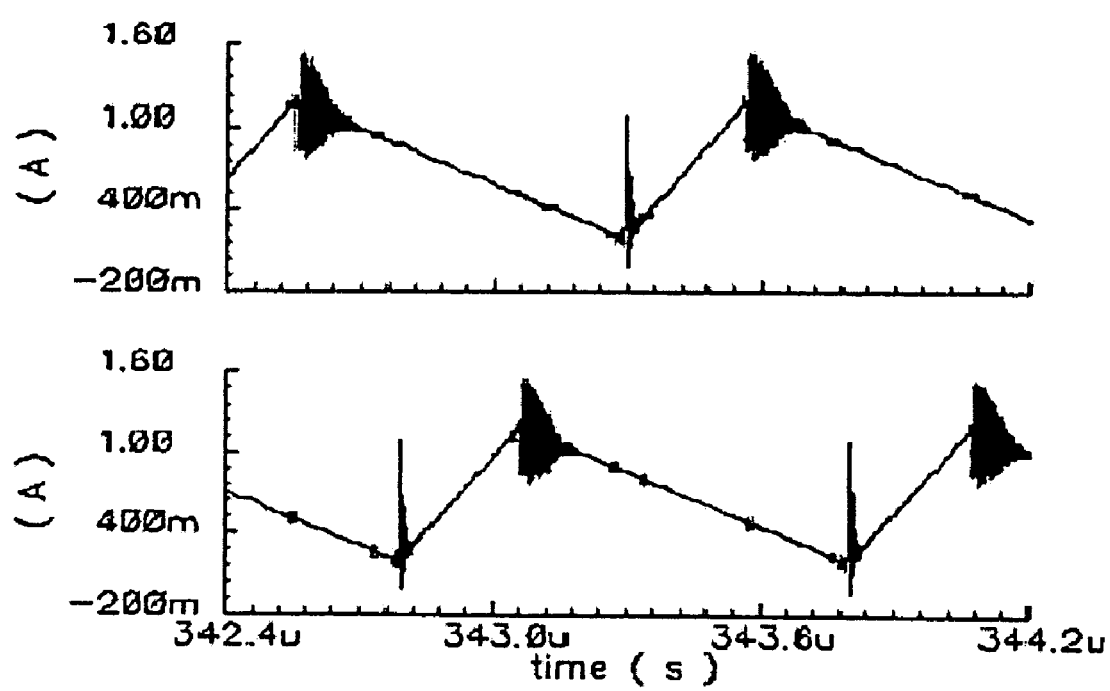
FIG. 10 illustrates a graphical representation of a two-phase current in multiphase mode, in accordance with a preferred embodiment of the present invention.

FIGS. 8-10 illustrate graphical representations of preferred embodiments, based on a selected output and particular passive components. The figures illustrate an exemplary embodiment. The voltage output selected is 1.32V, while the inductor 205 is 1 uH and the capacitor 206 is 500 uF. The output current is 3.3 A, and PVdd=Vdd, which is 5V. The compensation network, as depicted in FIG. 6, includes a resistor 203 of 1.8 kΩ, capacitor 202 of 33 nF.

FIG. 8 depicts a sawtooth output of voltage. FIG. 9 depicts the output of the phase clock signal for a two-phase operation (two buck converters 100). FIG. 10 depicts the current sharing between the two buck converters 100 in the two-phase operation.

The discrete devices that establish the graphical representation of FIGS. 8-10 can, preferably, have the values of Table 4.

TABLE 4

| Reference | Value |
|---|---|
| Capacitor 201 | 10 nF |
| Capacitor 202 | 33 nF |

TABLE 4-continued

| Reference | Value |
| --- | --- |
| Resistor 203 | 1.8 kΩ |
| Capacitor 204 | 100 nF |
| Inductor 205 | 1 µH |
| Capacitor 206 | 500 µH |
| Resistor 207 | 400 mΩ |
| Capacitor 208 | 270 pF |
| Resistor 209 | 5 kΩ |
| Capacitor 210 | 270 pF |

Generally speaking, the present invention, a buck converter, is an improved power synchronous buck regulator for converting input voltage ranging from approximately 3V to 5V down to approximately 0.7-1.0V, 1.2V, 1.5V, 1.8V, 2.5V, and 3.3V without the use of resistor dividers. The voltage input identifiers select one of the possible output settings for flexibility and accuracy. The integrated FETs can provide a continuous current of at least 6 A. Additionally, peak current mode and an improved oscillator enable multiphase operation, up to ten buck converters, for up to 60 A output current. The multiphase operation reduces the output inductor size, and bulk capacitors. Moreover, the multiphase operation yields higher efficiency and provides high transient response for demanding applications. Accordingly, the present invention provides a flexible and cost effective improvement over single phase and discrete solutions.

While the invention has been disclosed in its preferred forms, it will be apparent to those skilled in the art that many modifications, additions, and deletions can be made therein without departing from the spirit and scope of the invention and its equivalents, as set forth in the following claims.

What is claimed is:

1. An integrated field emitting transistor buck converter for down converting a first voltage to a lower, second voltage, the buck converter comprising:
    an oscillator for producing a periodic clock signal, the oscillator comprising a first input, a first output, a second output, and a third output;
    a soft start circuit for enabling a smooth start and voltage sequencing, the soft start circuit comprising a first input coupled to the first output of the oscillator, and a first output;
    an error amplifier for amplifying a first signal, the error amplifier comprising an inverting input, a non-inverting input, and a first output;
    a ramp generator for amplifying a second signal, the ramp generator comprising a first output; and
    a pulse width modulator for holding a frequency constant while the width of a power pulse is varied, the pulse width modulator comprising a first input coupled to the second output of the oscillator, a second input coupled to the first output of the soft start circuit, a third input coupled to the first output of the error amplifier, and a fourth input coupled to the first output of the ramp generator.

2. The buck converter of claim 1, wherein the components of the buck converter are electrically isolated from an external resistor divider.

3. The buck converter of claim 1, wherein the components of the buck converter are operable without an external resistor divider.

4. The buck convener of claim 1, further comprising:
    an internal resistor divider comprising a first output coupled to the inverting input of the error amplifier; and
    a band gap circuit for generating of an accurate voltage, the band gap circuit comprising a first output coupled to the non-inverting input of the error amplifier.

5. The buck convener of claim 4, further comprising a first input voltage and a second input voltage, the first input voltage and the second input voltage coupled to a comparator for selecting the input voltage; the comparator comprising an output coupled to an input of the internal resistor divider.

6. The buck converter of claim 1, further comprising a non-overlap clock generator and level shifter for generating a non-overlap clock signal, the non-overlap clock generator and level shifter comprising a first input coupled to a first output of the pulse width modulator.

7. The buck converter of claim 1, wherein
    the third output of the oscillator is an output of the buck converter; and
    the first input of the oscillator is an input clock signal to the buck converter.

8. A power conversion system comprising:
    a first buck converter comprising:
        a first connection (CLKIN) for receiving a clock signal;
        a second connection (CLKOUT) for outputting a clock signal;
        a third connection (ENSS) for enabling a soft start;
        a fourth connection (COMP) for outputting an error amplifier output;
        a fifth connection (FB) for receiving inverting input for the error amplifier;
        a sixth connection (Vid0) for a receiving first output voltage identifier;
        a seventh connection (Vid1) for a receiving second output voltage identifier;
        an eighth connection (GND) for coupling to a ground signal;
        a ninth connection (PGND1) for coupling to a first power ground signal;
        a tenth connection (PGND2) for coupling to a second power ground signal;
        an eleventh connection (PHASE1) for outputting a first phase output;
        a twelfth connection (PHASE2) for outputting a second phase output;
        a thirteenth connection (PHASE3) for outputting a third phase output;
        a fourteenth connection (PHASE4) for outputting a fourth phase output;
        a fifteenth connection (BOOST) for outputting a bootstrap output;
        a sixteenth connection (PVdd1) for receiving a first power supply for power stage;
        a seventeenth connection (PVdd2) for receiving a second power supply for power stage;
        an eighteenth connection (Vdd) for receiving a voltage supply signal;
        a nineteenth connection (SLOPE) for receiving a voltage slope; and
        a twentieth connection (SYNC) for receiving an external clock signal.

9. The power conversion system of claim 8, further comprising:
    the first connection (CLKIN) coupled to the voltage supply signal;
    a first capacitor coupled between the ground signal and the third connection (ENSS);
    a second capacitor coupled between the fourth connection (COMP) and a first resistor, the first resistor coupled between the second capacitor and the ground signal;

the sixth connection (Vid0) and the seventh connection (Vid1) coupled to the ground signal;

the eighth connection (GND) coupled to the ground signal (GND);

the ninth and tenth connections (PGND1 and PGND2) coupled to one another and coupled to the ground signal (GND);

the eleventh, twelfth, thirteenth, and fourteenth connections (PHASE1, PHASE2, PHASE3 and PHASE4) coupled to one another to generate a first node;

a third capacitor coupled between the fifteenth connection (BOOST) and the first node;

the sixteenth and seventeenth connections (PVdd1 and Vdd2) coupled to one another and coupled a second node;

the eighteenth connection (Vdd) coupled to the voltage supply signal;

a fourth capacitor coupled between the nineteenth connection (SLOPE) and the ground signal (GND);

a second resistor coupled between the input voltage and a third node;

a fifth capacitor coupled between the third node and the ground signal; and the twentieth connection coupled to the third node.

10. The power conversion system of claim 9, further comprising a first inductor coupled between the first node and a fourth node;

a sixth capacitor coupled between the fourth node and the ground signal; and a third resistor coupled between the fourth node and the ground signal.

11. The power conversion system of claim 10, wherein the fourth node is the output of the power conversion system.

12. The power conversion system of claim 8, the second connection (CLKOUT) being an output of the buck converter for providing an output clock signal.

13. The power conversion system of claim 8, the second node coupled to a power supply signal.

14. The power conversion system of claim 8, further comprising a second buck converter identical to the first buck converter; and a third buck converter identical to the first buck converter, wherein the first, second and third buck converters are in communication with each other.

15. The power conversion system of claim 14, further comprising:

a first resistor coupled between the ground signal and a first capacitor;

the first capacitor coupled between the first resistor and the fourth connection (COMP) of the first, second, and third buck converters;

a second capacitor coupled between the ground signal and a first node;

a second resistor coupled between the voltage supply signal and the first node;

the first node coupled to the twentieth connection (SYNC) of the first, second and third buck converters;

the second connection (CLKOUT) of the first buck converter coupled to the first connection (CLKIN) of the second buck converter; the second connection (CLKOUT) of the second buck converter coupled to the first connection (CLKIN) of the third buck converter; the second connection (CLKOUT) of the third buck converter coupled to the first connection (CLKIN) of the first buck converter;

a third capacitor coupled between the fifteenth connection (BOOST) of the first buck converter and a second node;

the eleventh connection (PHASE1) of the first buck converter coupled to the second node;

a first inductor coupled between the second node and a load node;

a fourth capacitor coupled between the fifteenth connection (BOOST) of the second buck converter and a third node;

the twelfth connection (PHASE2) of the second buck converter coupled to the third node;

a second inductor coupled between the third node and the load node;

a fifth capacitor coupled between the fifteenth connection (BOOST) of the third buck converter and a fourth node;

the thirteenth connection (PHASE3) of the third buck converter coupled to the fourth node;

a third inductor coupled between the fourth node and the load node;

a load circuit coupled between the load node and a third resistor;

the third resistor coupled between the load circuit and a fifth node;

a fourth resistor coupled between the fifth node and a ground signal;

the fifth node coupled to the fifth connection (FB) of the first buck converter;

the fifth connection (FB) of the second and third buck converters am coupled to the voltage supply signal, which is coupled to the eighteenth connection (Vdd) of the second and third buck converters.

* * * * *